(12) United States Patent
Morizio et al.

(10) Patent No.: US 6,255,974 B1
(45) Date of Patent: Jul. 3, 2001

(54) PROGRAMMABLE DYNAMIC RANGE SIGMA DELTA A/D CONVERTER

(75) Inventors: James C. Morizio, Durham; Michael C. Hoke; Scott Tucker, both of Raleigh; Elizabeth Danford, Durham, all of NC (US)

(73) Assignee: Mitsubishi Electric and Electronics USA, Inc, Durham, NC (US)

( * ) Notice: Subject to any disclaimer, the term of this patent is extended or adjusted under 35 U.S.C. 154(b) by 0 days.

(21) Appl. No.: 09/227,574

(22) Filed: Jan. 8, 1999

(51) Int. Cl.[7] .................................................. H03M 3/00
(52) U.S. Cl. ..................... 341/143; 341/155; 341/139; 341/118
(58) Field of Search ..................... 341/143, 118, 341/139, 155, 156, 116, 158, 169, 170, 126, 141

(56) References Cited

U.S. PATENT DOCUMENTS

| | | | |
|---|---|---|---|
| 4,875,049 | 10/1989 | Yoshida | 341/159 |
| 4,990,913 | 2/1991 | Beauducel | 341/139 |
| 5,065,157 | * 11/1991 | Ribner et al. | 341/143 |
| 5,134,401 | 7/1992 | McCartney et al. | 341/143 |
| 5,187,482 | * 2/1993 | Tiemann et al. | 341/143 |
| 5,241,310 | * 8/1993 | Tiemann | 341/143 |
| 5,389,927 | 2/1995 | Turney et al. | 341/139 |
| 5,422,643 | 6/1995 | Chu et al. | 341/141 |
| 5,684,480 | 11/1997 | Jansson | 341/139 |
| 5,691,720 | 11/1997 | Wang et al. | 341/143 |

* cited by examiner

Primary Examiner—Brian Young
Assistant Examiner—John Nguyen
(74) Attorney, Agent, or Firm—Burns, Doane, Swecker & Mathis, L.L.P.

(57) ABSTRACT

A sigma-delta analog-to-digital (A/D) converter has an analog modulator, and an adjustable reference voltage circuit that provides a reference voltage to the analog modulator along a feedback path during A/D conversion. The reference voltage circuit includes a reference voltage generator that provides a plurality of positive and negative polarity signals to a gain multiplexer. The gain multiplexer selectively supplies a pair of positive and negative polarity signals to the analog modulator based on a select signal produced by a gain register and a microprocessor interface bus that together allow adjustment of the range of operation and performance of the sigma-delta A/D converter. This adjustment is made based on a particular application in which the converter is implemented; as the relative input power of an input signal changes, the sigma-delta A/D converter as dynamically adjusted, realizes higher performance.

7 Claims, 6 Drawing Sheets

PROGRAMMABLE DYNAMIC RANGE SIGMA DELTA A/D CONVERTER

BACKGROUND OF THE INVENTION

1. Technical Field

The invention relates to analog-to-digital (A/D) converters, and in particular to a novel sigma-delta A/D type converter having a programmable input reference voltage circuit that enables conversion to be tailored to input voltage amplitudes.

2. Description of Related Art

Analog-to-digital (A/D) conversion is the process of converting a continuous range of analog signals into digital codes, or quantization levels. Increasing the maximum number of digital codes provides greater resolution and more granularity of scale which leads to more accurate digital sampling.

However, AID converters (also know as quantizers) have a maximum sampling rate that limits the speed at which they can perform continuous conversions, and hence the number of digital codes produced. The sampling rate is the number of times per second that the analog signal can be sampled and reliably converted into digital code. The minimum sampling rate must be at least two times the highest frequency of the analog signal sampled to satisfy the Nyquist sampling criterion (two times the highest frequency sampled is termed the "Nyquist rate"). Sampling above the Nyquist rate (oversampling) creates a more accurate digital representation of the analog signal.

There are many types of oversampling A/D conversion methods. So-called "sigma-delta conversion," one such method, is characterized by oversampling the analog input signal far above the Nyquist rate (e.g., between 16 and 256 times the Nyquist rate) and converting the oversampled signal to a digital signal.

Referring to FIG. 1, a conventional, first order, sigma-delta A/D converter arrangement 100 employs an oversampled modulator 112 sampling at a rate well above the Nyquist rate. The modulator 112 comprises an integrator 103 that performs a time domain integration of a sampled difference between an input analog waveform applied at input terminal 101 and a feedback signal produced by D/A converter 105, produced at summer 102. The output of integrator 103 is applied to A/D converter 104, the output of which is applied to a digital filter 106 and also fed back, through D/A converter 105, to summer 102.

A/D converter 104 and D/A converter 105 employed in modulator 112 may each be of single bit resolution (e.g., a simple comparator and a pair of switches coupling the comparator output to each of two reference voltages, respectively) or may be multi-bit circuits. The following discussion will assume the latter.

The analog input signal applied to input terminal 101, is oversampled at a high rate (e.g., greater than 16:1), and differentially summed with the feedback signal at summer 102 to produce an error signal to be applied to integrator 103. Integrator 103 in turn produces an integrated output signal of 1-bit resolution, converted to a multi-bit digital signal by A/D converter 104.

This multi-bit digital signal is applied to a digital filer 106 which removes quantization noise to provide an output signal of increased signal-to-noise ratio (SNR), a parameter that is a measure of performance as described in more detail later. The filtered signal is supplied by filter 106 to a decimator 107 that converts the filtered signal to a multi-bit word output at the Nyquist sampling rate (two times the maximum frequency of input bandwidth). Thus, an appropriately sized output multi-bit word is provided by decimator 107, but reduced from a high sampling rate of relatively low bit resolution to a lower sampling rate having relatively high bit resolution. Hence, digital filter 106 and decimator 107 convert oversampled A/D output signals from analog modulator 112 to a multi-bit Nyquist rate digital word.

A/D converter 104 also supplies its digital output signal to the input of a D/A converter 105 which performs a reconversion to an analog signal generally complementary to the operation of A/D converter 104. The reconverted analog signal is differentially summed with the input signal to derive the error signal that is integrated with the previous data sample and error values, and converted to an updated digital value.

The error signal applied to integrator 103 reflects not only changes in the input signal and aliasing errors due to the limit of resolution of A/D converter 104 (which will be reflected in the D/A converted signal), but also errors due to deviations from complementarity of the output signals produced by A/D converter 104 and D/A converter 105. Integrator 103 accumulates all such errors without regard to source. Therefore, to avoid discrepancies in the accumulated error value, the resolution and accuracy of the D/A conversion must be at least as great as that of the final decimated A/D conversion. D/A converter 105 must be capable of processing at least as many bits as the overall A/D converter 100 after filtering and decimation, at an accuracy not less than the incremental value corresponding to the least significant bit (LSB) of the overall A/D converter 100 after filtering and decimation.

The performance of sigma-delta converter is usually expressed in terms of signal-to-noise ratio (SNR), computed by dividing rms (root mean square) input signal power by quantization noise power. For example, for a conventional second order sigma-delta analog section (one having two summers and two integrators):

$$SNR = M^5 * (30K^2)/(\Delta^2 \Pi^4) \quad \text{EQ (1)}$$

where:
- M is the oversampling ratio defined as the ratio of the sampling rate to the Nyquist rate;
- K is the peak amplitude of the input signal being converted; and
- $\Delta$ is the range of the quantizer over which conversion is accomplished, and is dependent on a reference voltage (Vref) used in conjunction with the conversion process.

Performance of a conventional second-order sigma-delta converter is depicted graphically in FIG. 2 with reference to plots 102, 104, and 106 (dashed lines). The plots 102, 104, and 106 illustrate the relationship between SNR and relative input signal power for oversampling ratios (M) equal to 64, 128, and 256, respectively. With reference voltage held constant, the differences between plots 102, 104, and 106 are based on differences in oversampling ratios (M). An increase in oversampling ratio (M) yields increased performance as depicted by peaks 108a, 108b, and 108c with SNR levels that increase successively. For example, the peak SNR amplitude 108a for plot 102 (M=64) is approximately at 80 dB, whereas that for plot 106 (M=256) is approximately dB. It should be noted that peak SNR amplitudes for all three plots 102, 104, 106 occur at approximately −6 dB on the relative input power axis. This is because the sigma-delta converter generating plots 102, 104, 106 use the same constant reference voltage (Vref).

For plots 102, 104, and 106, the range (Δ) is fixed and constant, with a constant reference voltage (Vref). Although range (Δ) is shown only for plot 102, the ranges (Δ) for plots 104 and 106 increase with an increase in oversampling rates (M) because the range (Δ) is extended to the point where the plot crosses (not shown for 104, 106) the relative input power axis. The range (Δ) of plot 102 spans between approximately −85 dB and slightly above zero on the relative input power axis. However, as quantizer saturation, clipping and distortion tend to occur above the −6 dB level, the operating range (Δ) of plot 102 is shown as extending only up to −6 dB, because performance of the sigma-delta converter significantly drops off above that point.

Typically, range (Δ) is also dependent on input power supply voltage level (Vdd). To optimize performance, it is desirable to match input amplitude (K) with the peak SNR level of the quantizer. This peak occurs at −6 dB for plot 102 at 108*a*. Replacing range (Δ) in EQ (1) to determine peak performance yields the following equation (for K≦Vdd/2):

$$SNR = M^5 \ast (30K^2)/((Vdd)^2 \Pi^4) \qquad \text{EQ (2)}$$

By analyzing EQ (2), it is determined that the peak SNR performance of the quantizer is achieved when input amplitude (K) matches ½ of the range (Δ) of the quantizer, i.e., when input amplitude (K)=Vdd/2.

However, a problem arises when input amplitude (K) fluctuates based on varying signals or varying applications for which the sigma-delta converter is used. In applications such as modem technology, input voltage amplitudes, and thus relative input power levels, fluctuate for various reasons. As the length of a telephone line that carries input signals requiring conversion is increased, the input voltage applied to the modem from that line tends to be reduced. Thus, the performance of the sigma-delta converter will vary depending on distance to the source. Furthermore, sigma-delta converters can be used in a variety of other applications, such as cellular telephones, hand-held camcorders, portable computers, and set-top cable TV boxes. Any of these applications can face fluctuating input signals depending on the time of use or the environment in which conversion is implemented.

One apparent disadvantage of conventional sigma-delta converters is that they are unable both to accommodate input signals having significant variance and maintain a high level of performance. Another disadvantage is an inability to shift range of performance to avoid saturation, clipping and distortion.

SUMMARY OF THE INVENTION

In accordance with the invention, a sigma-delta analog-to-digital (A/D) converter comprises an input circuit having a summer that receives and sums oversampled analog input voltage signals and analog reference voltage signals, an integrator that integrates said summed signals supplied by said summer, an analog-to-digital converter that converts the output of said integrator to digital signals based on an amplitude of said analog reference voltage signals, a decimator that receives the digital signals represented by a number of bits supplied by said analog-to digital converter and supplies an increased number of bits at a rate below the oversampled rate; and an adjustable reference voltage circuit that selectively provides said analog reference voltage signals, from among a plurality of analog reference voltage signals, to said analog circuit based on the digital signals supplied by the analog-to digital converter and an amplitude voltage range of said analog input voltage signals over a period of time.

According to one aspect of the present invention, a method of converting analog input voltage signals to digital output signals comprises receiving an analog voltage signal; identifying an input amplitude voltage range of said input analog voltage signal received over a period of time; developing a feedback reference voltage signal of a magnitude corresponding to said input amplitude voltage range; converting said input analog signal to a corresponding digital signal, including adjusting an operating range, determined by measuring relative input power of the analog input voltage signal, over which said analog circuit converts to said digital signals on the basis of said feedback reference voltage.

Additional objects, advantages and novel features of the invention will be set forth in, or apparent from the following detailed description of the preferred embodiments of the invention.

BRIEF DESCRIPTION OF THE DRAWINGS

Reference is made to the attached drawings, wherein elements having the same reference numeral designations represent like elements throughout and wherein.

DETAILED DESCRIPTION OF THE INVENTION

Figure 3:
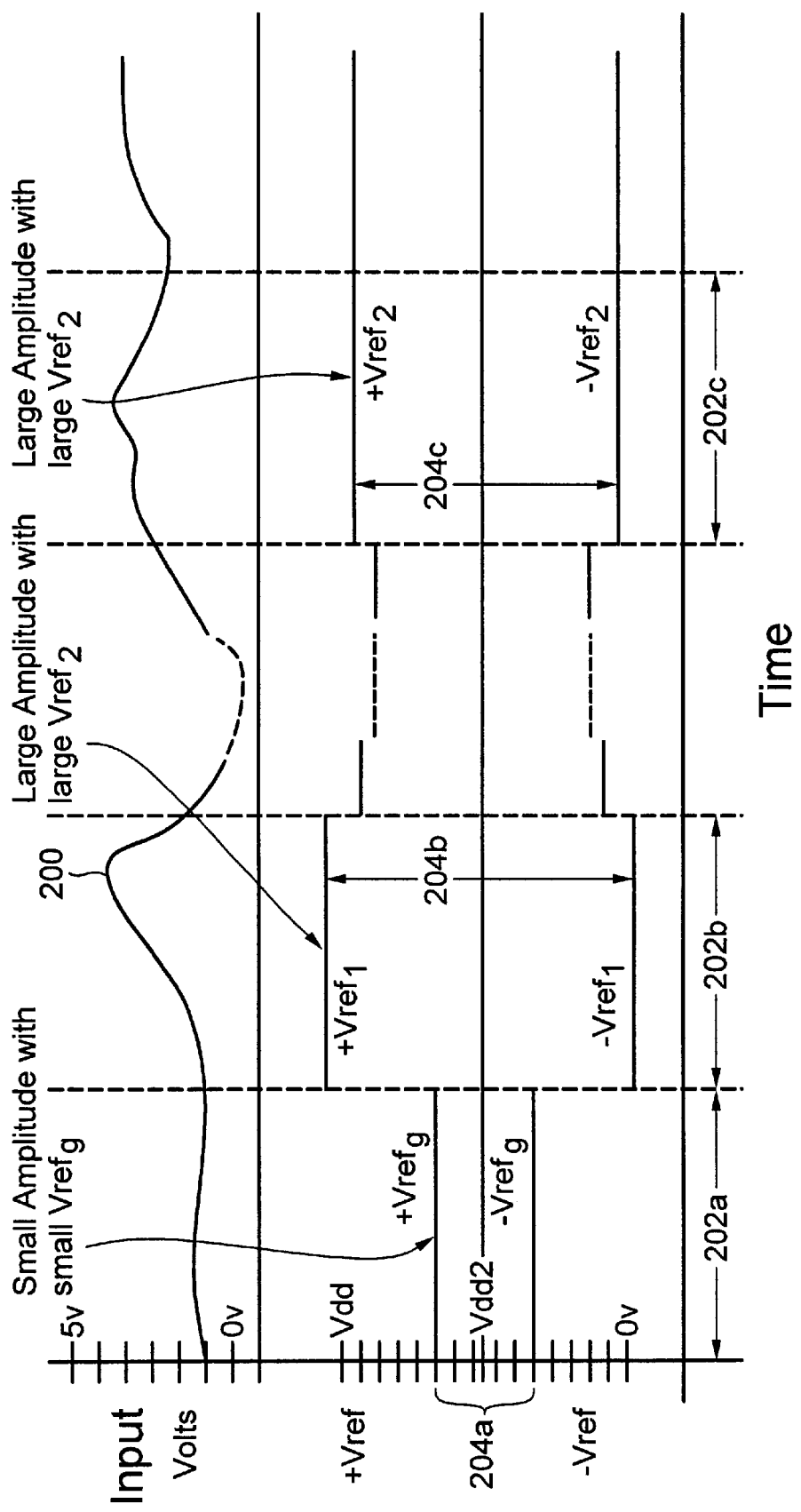
FIG. 3 is a graphical representation of varying analog input signals and reference voltages used to adjust performance to accommodate variances in input voltage.

FIG. 3 is a graph of an analog input signal 200 varying in amplitude over discrete time periods 202*a*, 202*b*, and 202*c* and supplied to an A/D converter. Time periods 202*a*, 202*b*, 202*c* are typically segments of time during which an A/D converter, such as a sigma-delta converter, receive an input signal from a telephone line in an example where the sigma-delta converter is located in a modem. The time periods 202*a*, 202*b*, 202*c* are selected to be of sufficient length to allow reference voltage range 204*a*, 204*b*, 204*c* to be adjusted by a user or computer, and to enable the sigma-delta converter to stabilize thereafter for reliable and accurate conversion.

FIG. 3 shows exemplary input voltage signal 200 varying over time periods 202, and reference voltages (VREF) required to adjust performance during those time periods.

The example of a modem will be given to describe, by way of example, the construction and features of a novel A/D converter, in accordance with the invention. During time period 202*a*, a modem connection over a long telephone line may cause analog input signal 200 to experience a low amplitude voltage as compared to the higher amplitude voltage input during time period 202*b*, as explained previously. As described with respect to FIG. 3, adjusting the reference voltage level (Vref) will alter the performance level of sigma-delta converters as measured by SNR (y-axis of FIG. 2). Thus, low input voltages received during time period 202a correspond to low relative input power (x-axis of FIG. 2). According to FIG. 2, low relative input power yields low SNR values. Hence, the converter outputs an increasing amount of noise as compared to output signal; this yields low performance. Since the peak SNR value is dependent on the reference voltage level adopted during conversion, a low reference voltage 204a is required compared to reference voltage 204b during time period 202b to achieve more acceptable performance.

Figure 1:
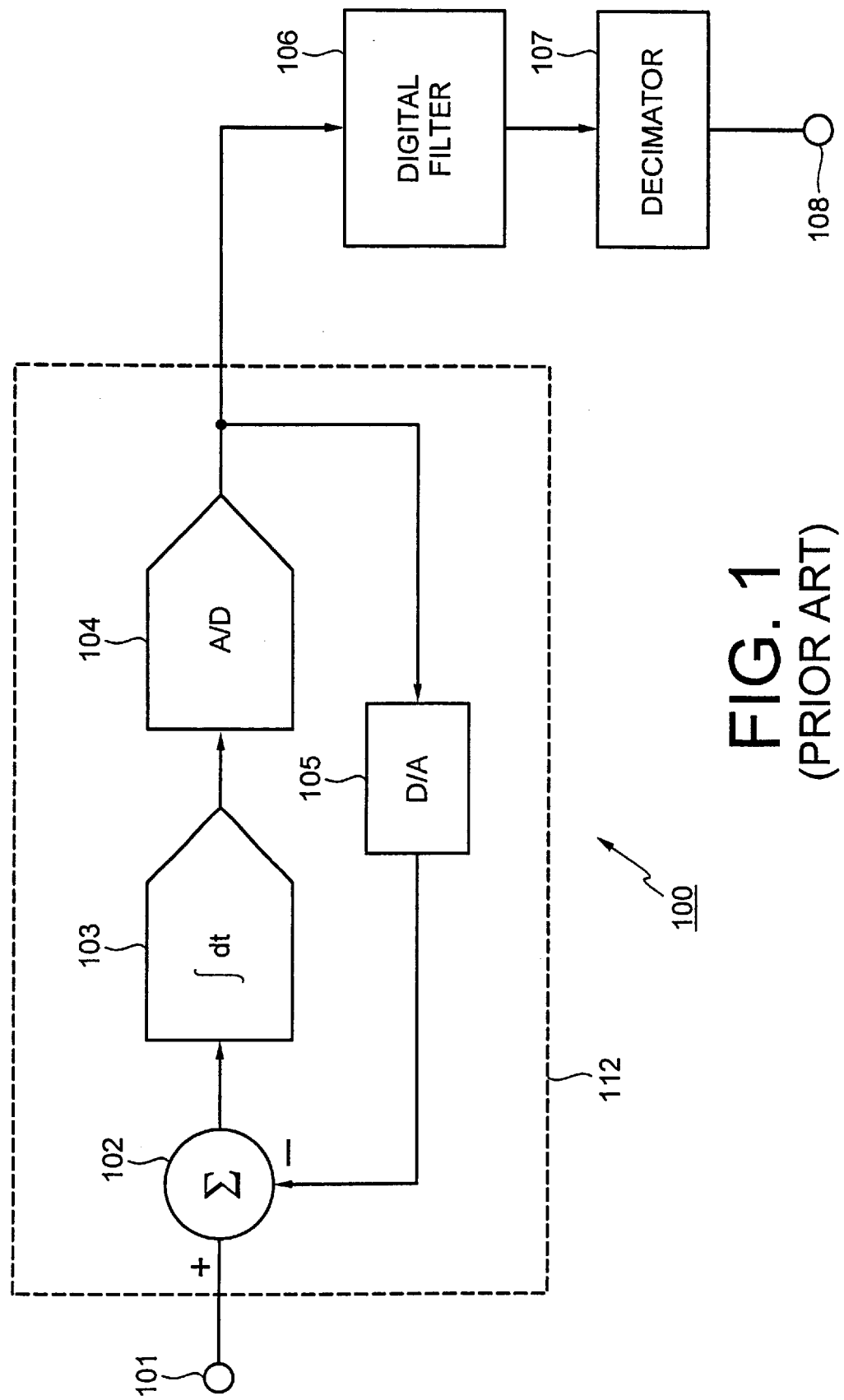
FIG. 1 depicts a conventional sigma-delta converter.
Figure 4:
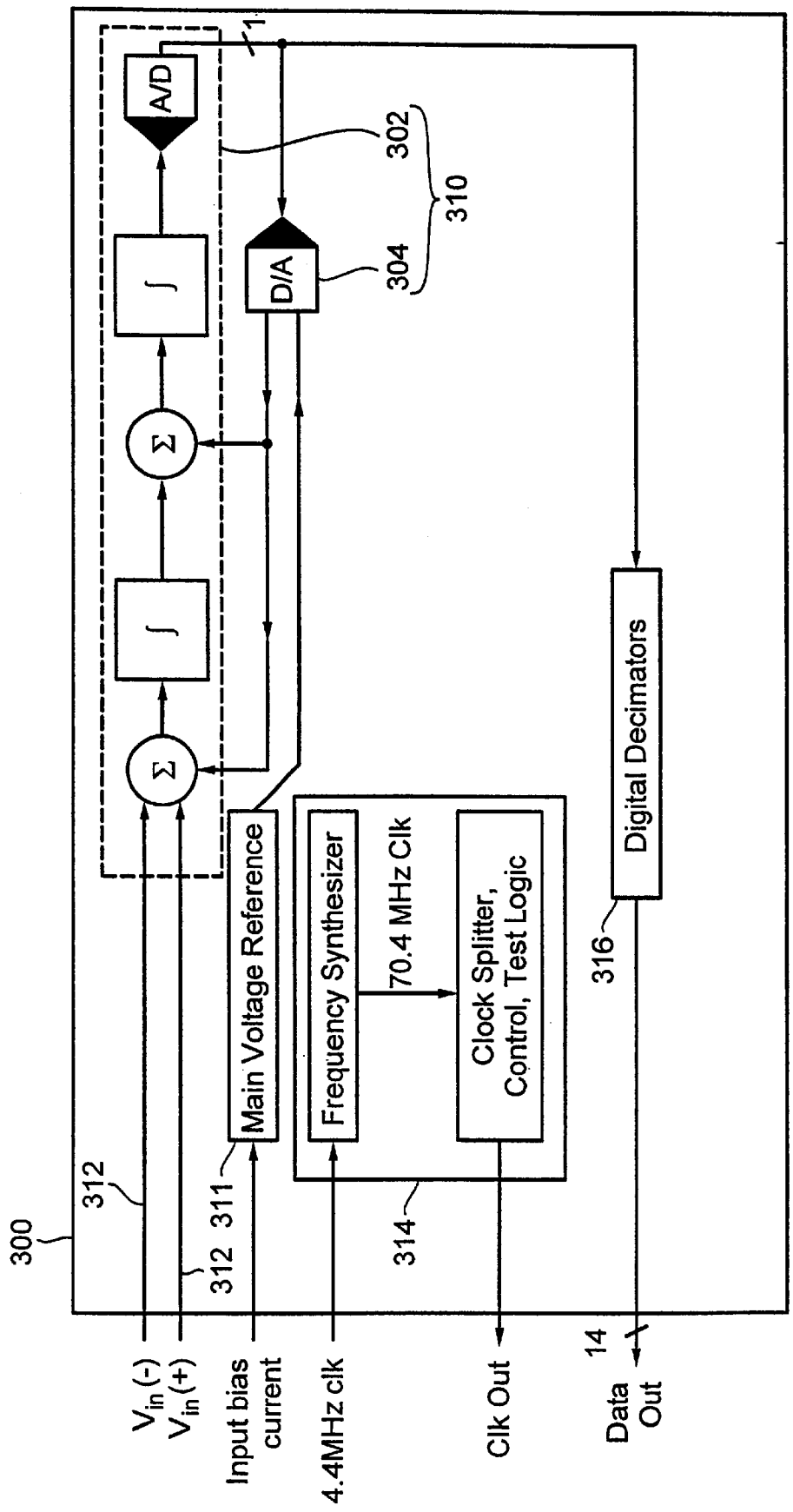
FIG. 4 is a block diagram of a sigma-delta converter having adjustable reference voltages in accordance with the invention.

FIG. 4 is a block diagram of an integrated circuit "chip" 300 which performs sigma-delta conversion with variation of reference voltage level (Vref) during conversion to dynamically adjust sigma-delta conversion performance in accordance with the invention. Circuit 300 comprises an analog modulator 302 and a digital-to-analog (D/A) converter 304 which together form a sigma-delta A/D converter 310 similar to that described in FIG. 1. The sigma-delta conversion requires a reference voltage signal (Vref) supplied by a main reference voltage generator 311 to D/A converter 304 for summing with a pair of voltage inputs 312 and deriving the error signal used within analog modulator 302. The conversion process performed by analog modulator 302 is synchronized through a clock generator 314. Analog modulator 302 receives at input 312 oversampled input analog voltage signals and converts these signals to a binary digital output (single bit) which is supplied to decimator 316. Decimator 316 receives the binary digital output and converts each of these bits to a multi-bit digital word. The digital word has a higher resolution (more bits) than the digital output from modulator 302, but is output at a frequency (the Nyquist frequency) lower than the oversampling frequency such that the binary value of the digital word accurately represents the amplitude of the oversampled analog input signal received at inputs 312.

Clock generator 314 operates in a conventional manner by dividing an input frequency, shown to be 4.4 MHz, by a quotient, such as 4, to provide four 1.1 MHz output clocks (Clk Out). The output clocks (Clk Out) provide the timing mechanism to synchronize various switching components, discussed below.

Figure 5:
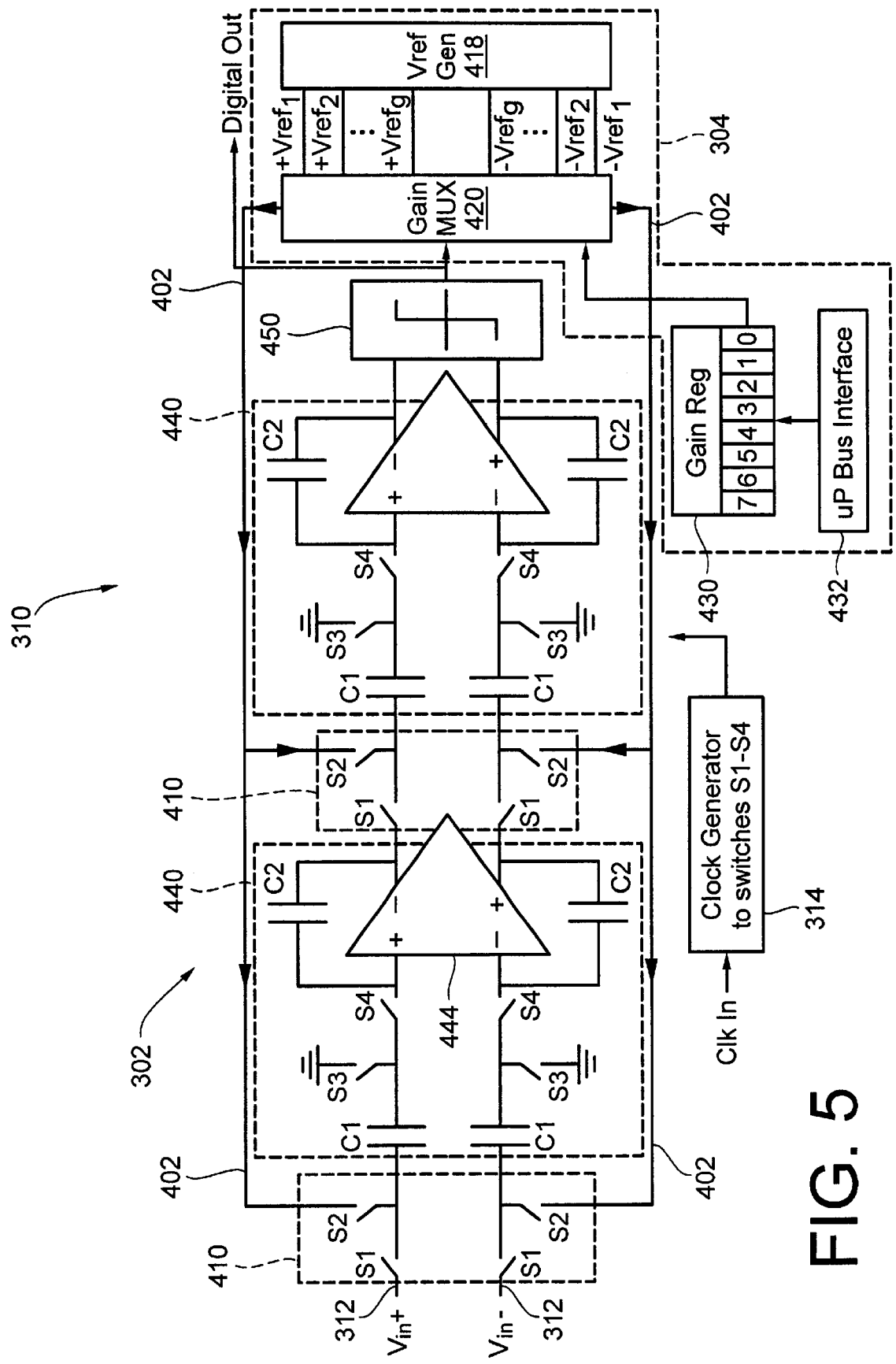
FIG. 5 is a schematic diagram of an embodiment of the invention, depicting a preferred manner of providing programmable reference voltages to the converter.

FIG. 5 is a schematic representation of a specific implementation per the present invention for providing programmable reference voltages. The sigma-delta converter 310 includes a representation of D/A converter 304 different from that shown in FIG. 4; the remaining elements of FIG. 4 are part of analog modulator 302.

Circuit 304 outputs an analog signal along a pair of feedback paths 402 to a summer 410. Circuit 304 also comprises a voltage generator 418 that receives voltage supplied by main reference voltage generator 311 to supply a plurality of reference voltages ($\pm Vref_{1-8}$) to a gain multiplexer (gain mux) 420. The combination of voltage generator 418 and gain mux 420 allows reference voltage circuit 304 to selectively supply a positive and negative polarity pair of voltages from among the plurality of reference voltages to summer 410. The combination of gain register 430 and microprocessor bus interface 432 supplies a select signal to gain mux 420 which allows the performance of the sigma-delta converter 310 to be programmable and hence made adjustable.

Microprocessor bus interface 432 can interface with a conventional computer bus to allow a user or computer to control selection of the reference voltage supplied by gain mux 420. Microprocessor bus interface 432 supplies a select signal to gain register 430 which loads one of registers 0–7 with appropriate digital information for selecting the reference voltage closest to the amplitude of input signal. The registers 0–7 of gain register 430 correspond to the plurality of reference voltage levels in a pre-determined manner such that activation of a register 0–7 identifies which discrete reference voltage level gain mux 420 is to supply reference voltage signals from voltage generator 418 to summer 410 along feedback paths 402. Feedback paths 402 each carry one of the positive or negative polarity reference voltages, the polarity of which is based on the analog input signal received at voltage inputs 312.

Summer 410 is connected to the pair of voltage inputs 312 (Vin+, Vin−) and receives the input signals requiring conversion, as well as the positive or negative polarity reference voltages from reference voltage circuit 304. Summer 410 comprises two pairs of switches S1 and S2. which close sequentially, first S1 then S2, to add the respective input signals to the reference voltage signals; (Vin+) plus (+Vref), and (Vin−) plus (−Vref).

The clock generator 314 controls the timing of the closure of all switches S1, S2, S3. S4. Clock generator 314 receives an input clock (clk in) which can be a 4.4 MHz clock as shown in FIG. 4. By way of example, clock generator 314 performs oversampling of the input clock (clk in) at any acceptable rates, e.g., 1 MHz or 100 MHz, to produce four clocks having a frequency of the input clock (clk in) divided by 4 (clk in/4).

Upon cycling through the closing and opening of switch S2, the summed signal is supplied to integrator 440. Initially, capacitors C1 draw the signal from the summer for storage until switch S3 is closed by clock generator 314 which enables capacitors C1 to supply the signal to a virtual ground connected to switch S3. Almost immediately after supplying the signals to switch S3, switch S4 is closed which supplies the signal to the combination of capacitors C2 and operational amplifier (op amp) 444 where integration is performed. Op amp 444 supplies the integrated signal to another summer 410 identical to the first.

It should be noted that the principles disclosed herein apply to all types of sigma-delta converters in which reference voltage is supplied along a feedback path to adjust performance. It should further be noted whereas the combination of summer 410 and integrator 440 are considered switched capacitor networks, the present invention is not intended to be limited to these embodiments.

As with most analog modulators of the type described above, a comparator 450 compares the signals supplied along the forward paths taken through the two summers 410 and two integrators 440. At comparator 450, the polarities of the signals supplied by inputs Vin+ and Vin− are compared to determine if the polarity of Vin+ is positive. If so, comparator 450 supplies gain mux 420 with a "high" signal which can be a voltage level greater than a predetermined threshold. If the polarity of the signal on Vin +is negative, comparator supplies a "low" signal to gain mux 420. The significance of comparator 450 is that the high signal supplied to gain mux 420 indicates that gain mux 420 should continue to supply the positive reference voltage signal along the feedback path leading to Vin+; otherwise, the negative reference voltage signal is supplied along the feedback path leading to Vin+. This type of determination, and the manner in which gain mux 420 adjusts the polarity of the output supplied by gain mux 420 are conventional.

Figure 6:
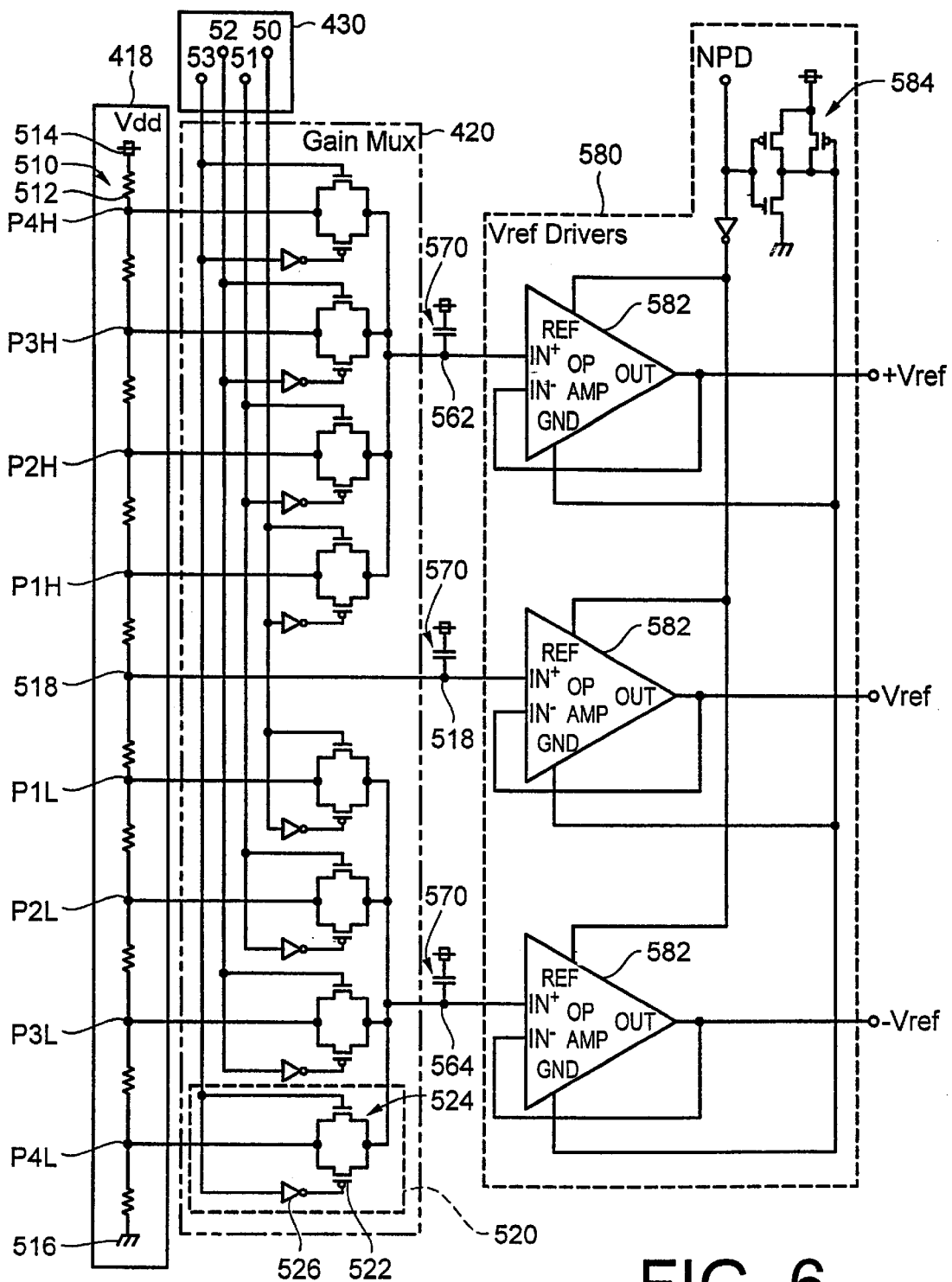
FIG. 6 is a schematic diagram of another embodiment of the invention, depicting a manner of providing to the converter a variety of reference voltages.

FIG. 6 is a schematic diagram of an embodiment of the present invention depicting a manner of providing a variety of reference voltages to the converter. Voltage generator 418 comprises a linear resistor tree 510 having resistors 512 connected serially between a source voltage 514 (Vdd) and ground 516. Since resistors 512 are symmetrically weighted about a voltage reference point 518 (designated as Vref), which is mid-way between source voltage 514 and ground, the voltage at point 518 is Vdd/2. Resistors 512 can be arranged with any suitable arrangement as long as symmetry about point 518 is preserved. An exponentially weighted linear resistor tree arrangement is below by way of example.

Gain mux 420 comprises a plurality of pass gates 520, each including a PMOS and an NMOS transistor 522, 524, respectively, connected with an inverter 526 to the gate of the PMOS transistor. NMOS transistor 524 and inverter 526 of each pass gate 520 are connected to a select line leading to gain register 430. Select lines 50, 51, 52, and 53 correspond to registers 0–3 in gain register 430. Only select lines 50, 51, 52, and 53 are shown in FIG. 5 for brevity; however any number of select lines could be implemented to allow selection among a corresponding number of voltages supplied by voltage generator 418.

Referring again to FIG. 6, by selecting register 3 (FIG. 5) in gain register 430, a signal is supplied along select line 53 to activate the pass gates which are connected to select line 53. Select line 53 activates the pass gate 524 closest to gain register 430 and pass gate 524 farthest from gain register 430. Assuming the source voltage (Vdd) 514 is at positive 5 volts, the voltage at midpoint 518 is 2.5 volts and the voltages at points P1H, P2H, P3H, P4H, and P1L, P2L, P3L, P4L between the resistors 512 are determined by resistance division.

In an exemplary embodiment, resistors 512 are weighted symmetrically about point 518 in an exponential manner. Thus, for example; the resistors between 518 and P1 may have a value of 100 ohms; the resistors between points P1 and P2 1 ohm; between P2 and P3 10 kohms; between P3 and P4 100 kohms; between P4H and Vdd (and between P4L and point 516) 1 Mohm. Calculating the voltages at P4H and P4L, supplied by gain mux 420 at output line 562 and 564, respectively, when select line 53 is chosen, provides:

$$P4 = Vdd*(Rtot)/Rsum$$

The variable Rsum equals the sum of all resistors 512 in the exponentially weighted linear resistor tree 510 and the variable Rtot equals the total sum of the resistances between point 516 and the point of interest, which in this example are points P4H and P4L. Rtot for P4H equals Rsum−1 Mohm, and Rtot for P4L equals 1 Mohm. In this example, Rsum equals 2*(1 Mohm+100 k ohm+10 k ohm+1 k ohm+100 ohm), or 2,222,200 ohms. Thus, P4H=5.0*(0.55)=2.75 volts, and P4L=5.0*(0.45)=2.25 volts. In other words, when the source voltage is 5.0 volts and the reference voltage is 2.5 volt, and select line 53 is chosen, the differential swing is 0.5 volt such that the voltage at point 562 is 2.75 and the voltage at point 564 is 2.25 volts.

By choosing select line 52, the voltage differential above and below the reference voltage Vref is reduced. Specifically, voltages P3H and P3L are passed by the pass gates connected to select line 52. Thus, the voltage supplied by gain mux 420 to points 562 and 564, respectively, is 5.0*(Rsum−1M ohm−100 k ohm)/Rsum=5.0*(0.505)=2.52 volts and 5.0*(0.495)=2.47 volts. The differential swing is 0.05 volt which represents a significant adjustment of 90% in the reference voltages supplied to analog modulator 302 compared to that for choosing select line 53. A capacitor 570 is connected to each of the points 562 as a stabilizer to dampen any noise. Gain mux 420 supplies voltages at points 518, 562, and 564 as voltages Vref, +Vref, and −Vref, respectively. Optionally, gain mux 420 supplies voltages at points 518, 562, and 564 to a driver 580 which buffers the voltages to drive the sigma-delta analog modulator 302 as voltages Vref, +Vref, and −Vref, respectively.

Driver 580 comprises conventional source-follower op amps 582 which are each connected to a conventional bias generator 584 that operates to turn the supply of voltage Vref, +Vref, and −Vref from source followers 582 on or off.

Referring once again to FIG. 2, the operation of the present invention is compared to the original operation described above. Specifically, the discussion of plots 102, 104, 106 correspond to the operation of a sigma-delta A/D converter having a constant reference voltage and oversampling ratios (M=64, 128, 256 respectively). Plots 602, 604, 606 show the operation of the same sigma-delta A/D converter having the same oversampling ratios (M), but shift the plots left as compared to plots 102, 104, 106. This left shift represents a change in performance of the sigma-delta converter such that peak amplitudes 608a, 608b, 608c cross the relative input power axis at approximately −16 dB. It should be noted that the SNR values remain unchanged for the respective oversampling rates.

The effect of shifting left results from reducing the reference voltage input along feedback paths 402 into switches S2 (FIG. 5). This reduction in reference voltage is achieved in an embodiment using gain mux 420 which passes a pair of reference voltages ±Vref supplied by reference voltage generator 418. Such a reduction in reference voltage can be achieved using gain register 430 in combination with microprocessor bus interface 432 to select registers 2, instead of register 3, which corresponds to select line 52 instead of select line 53 in FIG. 6.

Figure 2:
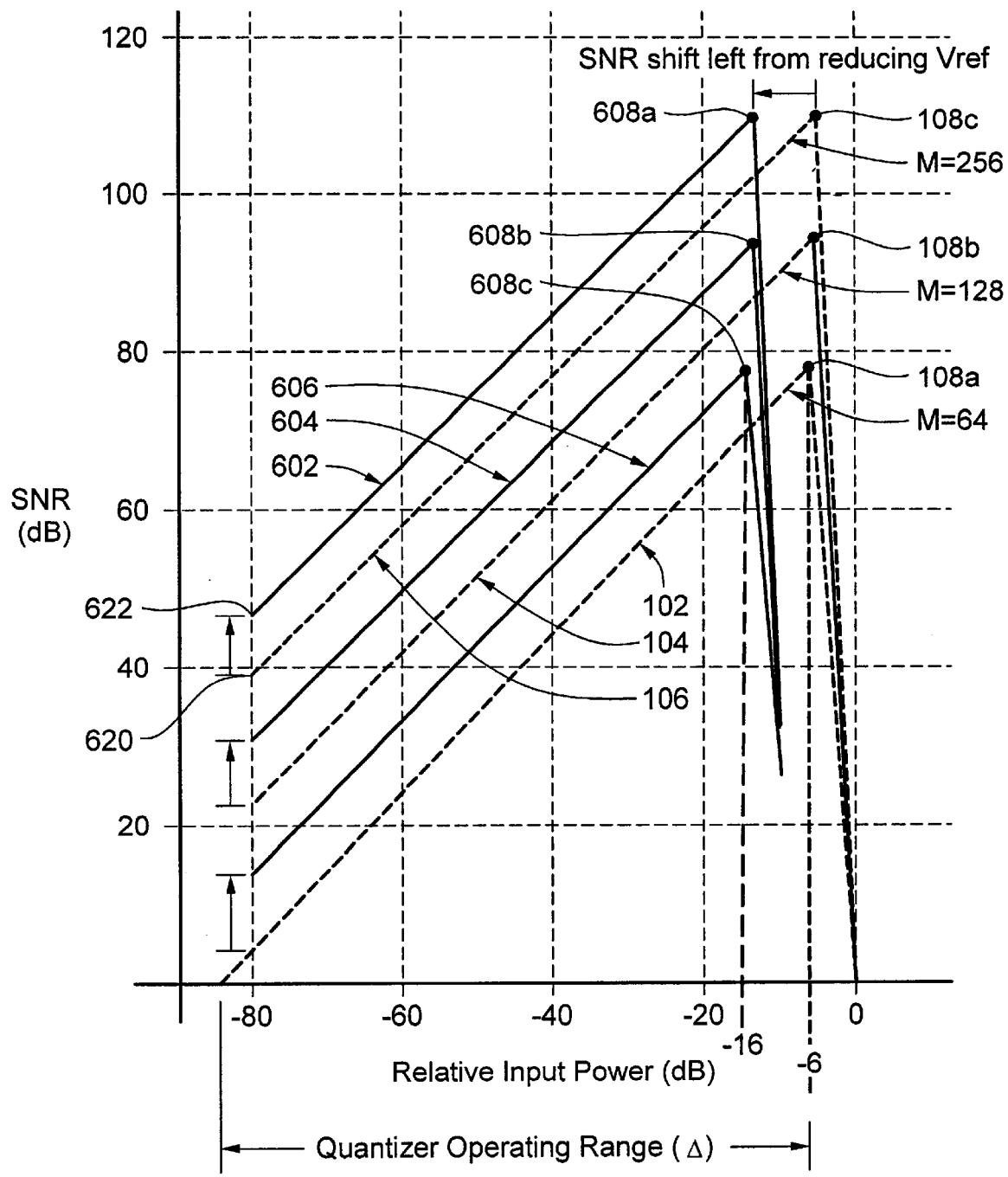
FIG. 2 is a graphical representation of operation of conventional sigma-delta converters.

A principal advantage of shifting left the SNR versus relative input power plots to those illustrated by 602, 604, 608 in FIG. 2 is that for smaller input signals, a larger SNR, equivalent to higher performance will occur. For example, at −80 dB input power for M=256, the SNR is increased from 40 dB (point 620) to 45 dB (point 622). This implies that the sigma-delta A/D converter using a smaller reference voltage level (Vref) is better suited for −80 dB relative input power signal levels. However, the peak amplitude is also shifted left from point 108c to 608c to a lower power level (−6 dB to 16 dB, respectively).

In conclusion, the embodiments of the sigma-delta A/D converter described above accommodate varying peak amplitudes of voltage input while providing high levels of performance in terms of signal-to-noise ratio, adjust the reference voltage level used during conversion which determines the level of conversion performance, and shift the range of performance to avoid saturation, clipping and distortion.

These advantages are attained by a sigma-delta analog-to-digital (AID) converter which comprises an input circuit having a summer that receives and sums oversampled analog input voltage signals and analog reference voltage signals, an integrator that integrates said summed signals supplied by said summer, an analog-to-digital converter that converts the output of said integrator to digital signals based on an amplitude of said analog reference voltage signals a decimator that receives the digital signals represented by a number of bits supplied by said analog-to digital converter and supplies an increased number of bits at a rate below the oversampled rate; and an adjustable reference voltage circuit that selectively provides said analog reference voltage signals, from among a plurality of analog reference voltage signals, to said analog circuit based on the digital signals supplied by the analog-to digital converter and an amplitude voltage range of said analog input voltage signals over a period of time.

The advantages are also attained by a method of converting analog input voltage signals to digital output signals, comprising receiving an analog voltage signal; identifying an input amplitude voltage range of said input analog voltage signal received over a period of time; developing a feedback reference voltage signal of a magnitude corresponding to said input amplitude voltage range; converting said input analog signal to a corresponding digital signal, including adjusting an operating range, determined by measuring relative input power of the analog input voltage signal, over which said analog circuit converts to said digital signals on the basis of said feedback reference voltage.

While this invention has been described in connection with what is presently considered to be most practical and preferred embodiments, it is to be understood that the invention is not limited to the disclosed embodiments, but, on the contrary, is intended to cover various modifications and equivalent arrangements included within the spirit and scope of the appended claims.

What is claimed is:

1. A sigma-delta analog-to-digital (A./D) converter, comprising:
   an input circuit having
      a summer that receives and sums oversampled analog input voltage signals and analog reference voltage signals,
      an integrator that integrates said summed signals supplied by said summer,
      an analog-to-digital converter that converts the output of said integrator to digital signals based on an amplitude of said analog reference voltages signals,
      a decimator that receives the digital signals represented by a number of bits supplied by said analog-to-digital converter and supplies an increased number of bits at a rate below the oversampled rate; and
   an adjustable reference voltage circuit that selectively provides said analog reference voltage signals, from among a plurality of analog reference voltage signals, to said analog circuit based on the digital signals supplied by the analog-to-digital converter and an amplitude voltage range of said analog input voltage signals over a period of time, wherein the adjustable reference voltages circuit includes an analog multiplexer and gain buffer that supplies a specific reference voltage to shift an operating range, measured by relative input power of the analog input voltage signals, over which said input circuit converts input analog signals to said digital signals.

2. The sigma-delta A/D converter of claim 1, wherein the adjustable reference voltage circuit further comprises a voltage generator, gain multiplexer and a buffer, and wherein the voltage generator supplies said plurality of analog reference voltage signals to said gain multiplexer, and said gain multiplexer controls an operating range over which conversion occurs.

3. The sigma-delta A/D converter of claim 2, wherein said adjustable reference voltage circuit further comprises:
   a bus interface unit; and
   a gain register, connected between said bus interface unit and said gain multiplexer,
   wherein said bus interface unit and said gain register provide a selected operating range selection to said gain multiplexer, said operating range selection being based on the amplitude voltage range of said analog input voltage signals over said period of time.

4. The sigma-delta A/D converter of claim 3, wherein said gain multiplexer further comprises:
   a linear resistor tree connected between a supply voltage and ground; and
   a plurality of selectable paired-pass gates connected to said linear resistor tree and corresponding to the number of gain registers, wherein said pass gates pass a portion of said supply voltage based on the indication of operating range selection provided by said ain register.

5. The sigma-delta A/D converter of claim 4, wherein said linear resistor tree is exponentially weighted.

6. The sigma-delta A/D converter of claim 4, further comprising a source-follower operational amplifier that buffers said portion of said supply voltage output from said gain multiplexer before being supplied to said input circuit.

7. The sigma-delta A/D converter of claim 4, further comprising a decimator that converts said digital signals to analog signals for output from said sigma-delta converter.

* * * * *

UNITED STATES PATENT AND TRADEMARK OFFICE
CERTIFICATE OF CORRECTION

PATENT NO. : 6,255,974 B1  
DATED : July 3, 2001  
INVENTOR(S) : James C. Morizio et al.

Page 1 of 1

It is certified that error appears in the above-identified patent and that said Letters Patent is hereby corrected as shown below:

<u>Column 10, claim 4,</u>  
Line 33, delete "ain" and insert therefor -- gain --.

Signed and Sealed this

Fifth Day of March, 2002

Attest:

Attesting Officer

JAMES E. ROGAN  
Director of the United States Patent and Trademark Office